United States Patent
Dalton

(10) Patent No.: US 7,385,857 B2
(45) Date of Patent: Jun. 10, 2008

(54) NON-VOLATILE, STATIC RANDOM ACCESS MEMORY WITH REGULATED ERASE SATURATION AND PROGRAM WINDOW

(76) Inventor: David Dalton, 3704 Leeds Cir., Colorado Springs, CO (US) 80907

( * ) Notice: Subject to any disclaimer, the term of this patent is extended or adjusted under 35 U.S.C. 154(b) by 0 days.

(21) Appl. No.: 11/644,196

(22) Filed: Dec. 22, 2006

(65) Prior Publication Data

US 2008/0043516 A1   Feb. 21, 2008

Related U.S. Application Data

(60) Provisional application No. 60/838,694, filed on Aug. 18, 2006.

(51) Int. Cl.
*G11C 11/34* (2006.01)

(52) U.S. Cl. .............................. 365/185.29; 365/185.24

(58) Field of Classification Search ........... 365/185.29, 365/185.24
See application file for complete search history.

(56) References Cited

U.S. PATENT DOCUMENTS

| | | | |
|---|---|---|---|
| 5,774,400 A * | 6/1998 | Lancaster et al. | 365/185.3 |
| 7,085,170 B2 * | 8/2006 | Mihnea et al. | 365/185.3 |
| 2007/0253258 A1 * | 11/2007 | Hsu et al. | 365/185.29 |

* cited by examiner

*Primary Examiner*—Michael T Tran
(74) *Attorney, Agent, or Firm*—Holme Roberts & Owen LLP

(57) ABSTRACT

A system and method for regulating the erase saturation in a semiconductor memory is disclosed. More particularly, the present invention measures the under-erase and over-erase condition of all SONOS transistors in an array of non-volatile SRAM cells and corrects the erase voltage to prevent over-erase and under-erase.

18 Claims, 10 Drawing Sheets

NON-VOLATILE, STATIC RANDOM ACCESS MEMORY WITH REGULATED ERASE SATURATION AND PROGRAM WINDOW

RELATED U.S. APPLICATION DATA

This application claims priority from and benefit to Provisional Application No. 60/838,694 filed on Aug. 18, 2006, entitled "Non-Volatile, Static Random Access Memory With Regulated Erase Saturation and Program Window," herein incorporated in its entirety by reference.

BACKGROUND OF THE INVENTION

1. The Field of the Invention

The present invention relates generally to non-volatile, static random access memory (nvSRAM) and, more specifically, to providing an erase voltage to the non-volatile SONOS transistors of an nvSRAM so as to prevent under/over erasure.

2. The Relevant Technology

In general, a computer system is comprised of a memory for holding data and programs, a processor for executing the programs or operating on the data held in memory, and an input/output device for facilitating communications between the computer system and a user. There are several different types of digital memories available for use in the memory portion of a computer system. In many instances, the particular application in which the computer system is intended to be used dictates the type of memory that is appropriate for all or a portion of the memory of the computer system. For instance, one application for a computer system in which an nvSRAM may be appropriate is in a portable computer system. Portable computer systems are generally designed to operate, if needed, with power supplied by a battery housed within the system. If the battery becomes incapable of providing power to the system and an alternative source of power is not available, the data held in memory could become irretrievably lost. In such applications, it is desirable to use an nvSRAM because the static random access memory (SRAM) portion is capable of retaining the data while power is present and providing the performance needed during normal operations, and the non-volatile memory (nv) portion is capable of retaining data for an extended period of time after power has been removed and once power is restored, reestablishing the data in the SRAM portion.

A basic nvSRAM memory device is comprised of (1) a plurality of nvSRAM memory cells; and (2) a controller for managing the operations of the nvSRAM memory cells. The nvSRAM cell is comprised of a static random access memory cell and a non-volatile memory cell. Briefly, the terms "random access memory" and "RAM" refer to the ability to access any one of a plurality of cells in the memory at any time to write/read data to/from the accessed cell. In contrast, other types of memory require that other memory locations be traversed before the desired memory location can be accessed. These types of memories (magnetic tape, for example) are typically much slower than a random access memories. The term "static" refers to the ability of the memory to retain data as long as power is being supplied. In contrast, the term "dynamic" refers to memories that retain data as long as power is being supplied and the memory is periodically refreshed. The term non-volatile refers to the ability of a memory cell to retain data in the absence of power.

An nvSRAM typically utilizes silicon/oxide/nitride/oxide/silicon (SONOS) nonvolatile cells to provide data retention to a standard high speed SRAM memory when the power is removed. An nvSRAM provides a solution in electronic systems where it is desirable to retain the configuration of the system just before a power failure event, such as redundant array storage. Other applications include high speed data logging with nonvolatile storage in cases where Flash or EEPROM memories are limited by the number of writes required, or by the slow write speed of these technologies. One significant advantage of an nvSRAM, compared with other nonvolatile technologies, is unlimited reads and writes to the SRAM portion of the nvSRAM since the data is written to non-volatile storage elements only upon power down. The nvSRAM is accessed with standard SRAM interfaces and timings; the non-volatile operations are transparent to the user. The non-volatile operations are typically accomplished by transferring data from active SRAM latches into a separate set of SONOS non-volatile cells connected by the appropriate circuitry.

The programming and erase voltages for the SONOS transistors of an nvSRAM vary in both duration and magnitude. For example, the typical erase voltages can range from $-11.5$ to $-8.9V$, 9.6 mS for SONOS transistors. The range of erase voltages on a SONOS transistor is due at least in part to a number of SONOS transistor and charge pump process differences and design marginalities that occur from lot-to-lot, wafer-to-wafer and die-to-die. A single erase voltage for all die would leave some transistors under-erased and some transistors over-erased.

Although nvSRAMs possess many desirable properties, there are limitations to its non-volatile properties. Principal among these limitations are the number of nv stores (endurance) and data retention lifetime. A typical non-volatile memory device will specify both endurance and data retention and guarantee these in its data sheet through extensive testing. Both endurance and data retention are affected by fabrication processes and process control as well as program and erase conditions of the non-volatile cells.

There are also two additional failure modes associated with nvSRAMs: failure to store at extreme cold temperatures and pre-latching failures during NV recall. Both types of failures can be addressed by choice of erase and programming voltages, as can endurance and data retention.

It is therefore desirable to provide a method for measuring the under-erase and over-erase condition of a plurality of SONOS transistors on a die and thereafter implement a proper erase voltage so as to prevent under/over erasure. It is also desirable to define program and erase conditions for an nvSRAM such that process variation will be negated while ensuring specified endurance and data retention.

BRIEF SUMMARY OF THE INVENTION

The present invention provides an nvSRAM that, for every non-volatile cell, is capable of adjusting the erase voltage as well as the erase time of the non-volatile cells by commands issued by automatic test equipment, and thereafter storing the optimum erase voltage setting and erase time setting in each device in NV memory storage locations. Similar circuitry for setting program voltage and program time are also included in this embodiment.

A method for preventing oversaturation in a first and second tri-gate structure in a non-volatile SRAM cell is further provided. The non-volatile SRAM has a volatile portion and a non-volatile portion. Each tri-gate structure in said non-volatile portion having a recall transistor, a store transistor and a SONOS transistor. A beginning level of an erase voltage is selected to erase the SONOS transistors in the trigate structure. An erase voltage is applied to the SONOS transistors in the trigate structure a first time. A threshold erase voltage is measured for each SONOS transistor in the cell when applying an erase voltage to each SONOS transistor.

The erase voltage is then applied to the SONOS transistors in the trigate structure a number of times after the first time. The saturated erase condition voltage is measured for each SONOS transistor in the trigate structure after the final time. A value of delta is calculated where delta is the difference between the threshold erase voltage and the saturated erase condition voltage. It is then determined if the delta value is within a specified range. The erase voltage is modified if the delta value is outside the specified range and then steps of the method are repeated using the modified erase voltage in place of the erase voltage until the delta is within the specified range. The erase voltage is stored if the delta value is within the specified range.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION OF THE PREFERRED EMBODIMENTS

Reference will now be made in detail to the preferred embodiments of the present invention, examples of which are illustrated in the accompanying drawings. A system and method for regulating erase saturation and program window in a non-volatile SRAM is disclosed. The disclosed method defines program and erase conditions for an nvSRAM such that process variation will be negated while ensuring specified endurance and data retention.

Figure 1:
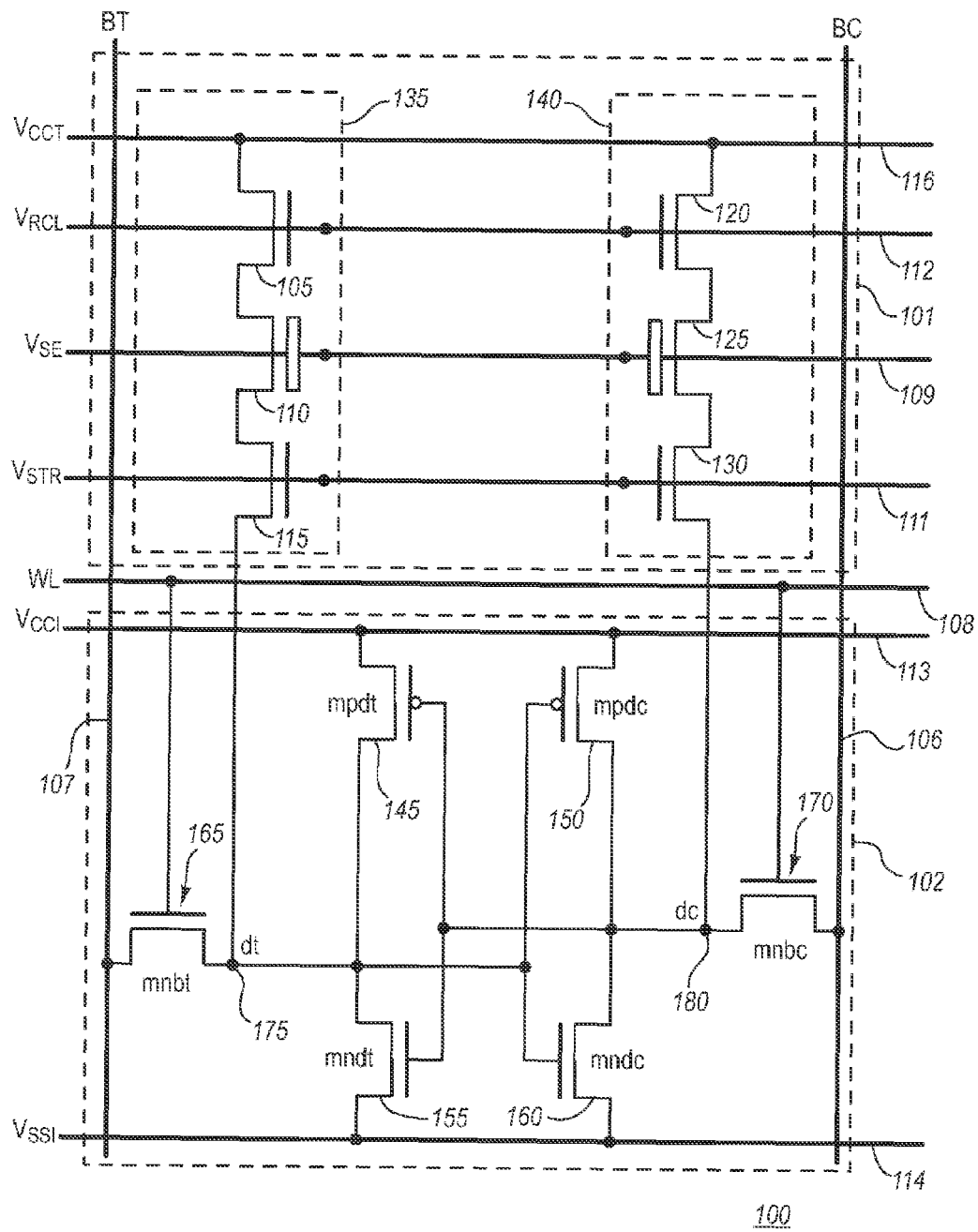
FIG. 1 is a schematic diagram illustrating an nvSRAM memory cell in accordance with one embodiment of the present invention.

FIG. 1 illustrates a typical nvSRAM cell 100 with a single SRAM and a series-connected, non-volatile memory cell, hereinafter referred to as nvSRAM device 100 in accordance with the following invention. While the nvSRAM device 100 is illustrated as having a single nvSRAM memory cell (in this case, the single SRAM and a single non-volatile memory cell), it should be appreciated that an nvSRAM device typically includes a plurality of nvSRAM cells that are integrated with a controller onto a single semiconductor chip to form an array.

A basic nvSRAM cell 100 is comprised of a static random access memory (SRAM) cell 102 that is capable of communicating a bit of data to and from an exterior environment and a non-volatile (nv) cell 101 for providing backup storage to the SRAM cell in the event power is removed from the nvSRAM cell 100. More particularly, the SRAM cell 102 is capable, as long as power is being provided, of receiving a bit of data from an exterior environment, retaining the bit of data, and transmitting the bit of data back to the exterior environment. If, however, power is removed from the SRAM cell 102, the SRAM cell will lose the bit of data. The nv cell 101 prevents loss of the bit of data by providing the capability to receive the bit of data from the SRAM 102, retain the bit of data in the absence of power being provided to the SRAM cell 102, and return the bit of data to the SRAM cell 102 when power is present. For example, if there is a possibility of power to the SRAM cell 102 being lost, the bit of data can be transferred from the SRAM cell 102 to the nv cell 101 in a store operation. At a later time, the bit of data can be returned from the nv cell 101 to the SRAM cell 102 in a recall operation. The SRAM cell 102 can then transmit the bit of data to the exterior environment, if desired.

Typically, the basic nvSRAM cell 100 is combined with other nvSRAM cells to form a memory array that is integrated onto a single semiconductor chip. Typical nvSRAM memory arrays are comprised of 1,048,576 nvSRAM cells. The motivation for creating integrated semiconductor chips with ever larger arrays of nvSRAM cells is that the area per cell decreases as more cells are integrated onto a chip. For example, four chips, each with arrays of 262,144 nvSRAM cells (an array of 512×512), occupy a greater surface area than a single chip with an array of 1,048,576 nvSRAM cells (an array of 1024×1024). The area occupied by a memory chip is important because many applications for the chip, such as personal computers, are continually attempting to provide more memory in less space.

In the illustrated example, the volatile portion 102 is a six transistor Static Random Access Memory (SRAM) cell. The word static indicates that the memory retains its contents as long as power remains applied. Random access means that locations in the memory can be written to or read from in any order, regardless of the memory location that was accessed last.

SRAM cell 102 typically has three states: standby, reading and writing. In the standby state, the circuit is idle waiting for a read or a write operation. In operation, the word line WL is not asserted and so transistors 165, 170 disconnect the SRAM cell 102 from the bit lines BT 107 and BC 106. The first cross coupled inverter formed by transistors 145, 155 and the second cross coupled inverter formed by transistors 150, 160 continue to reinforce each other and the data remains unchanged.

In the read state, data within SRAM cell 102 is requested. Assume for purposes of explanation that the contents of the memory of SRAM cell 102 is a 1 stored at dt 175. The read cycles starts by pre-charging both the bit lines to a logical 1, then asserting the word line WL, thereby enabling both transistors 165, 170. The values stored in dt 175 and dc 180 are transferred to the bit lines BT 107 and BC 106 by leaving BC at its pre-charged value and discharging BT through transistor 165 and transistor 155 to a logical 0. On the BC side, transistor 150 and transistor 170 pull the bit line towards a $V_{CCI}$, a logical 1. If, however, the contents of the memory of SRAM cell 102 was a logic 1, the opposite would happen and BT would be pulled towards a logic 1 and BC towards a logic 0.

In the write state, the contents of SRAM cell 102 is updated. The write cycle begins by applying the value to be written to the bit lines BT 107 and BC 106. If a logic 0 is desired to be written, a 0 is applied to the bit lines by setting BT to 0 and BC to 1. A logic 1 is written by inverting the values of the bit lines BT 107 and BC 106. The word line WL is asserted and the value that is to be stored is latched in. The bit line input drivers are designed to be much stronger than the relatively weak transistors in the cell itself, so they can easily override the previous state of the cross-coupled inverters.

Each bit in an SRAM is stored on four transistors that form two cross-coupled inverters. The storage cell has two stable states, which are used to denote a 0 and a 1. Two additional transistors serve to control access to a storage cell during read and write operations. Accordingly, six transistors store one memory bit.

Access to each cell is enabled by the word line (WL) that controls the two transistors 165, 170. Transistors 165, 170 control whether the cell should be connected to the bit lines BT 107 and BC 106. Transistors 165, 170 are also used to transfer data for both the read and write operations. Two bit lines BT and BC are not required, however, both the signal and the complement of that signal are provided to improve noise margins.

Generally, as illustrated in FIG. 1, nvSRAM cell 100 comprises a plurality of n-channel, Field-Effect Transistors (FETs) and p-channel FETs 145, 150 and a plurality of nonvolatile elements, such as nonvolatile transistors or capacitors. It should, however, be appreciated that other types of transistors and combinations of different types of transistors can be utilized.

As shown specifically in FIG. 1, the volatile portion 102 includes a first SRAM FET mndt 155 and a second SRAM FET mndc 160 that are in a 1-bit latch configuration in which the drain of each FET is coupled to the gate of the other FET and the source of one FET is coupled to the source of the other FET. In the latch configuration, the first and second SRAM FETs 155, 160 operate as switches that are either in an ON state or an OFF state. More specifically, the latch operates so that when one of the first and second SRAM FETs 155, 160 is in an ON state the other is necessarily in an OFF state. This manner of operation permits the latch to differentially store a bit of data, which can have either a 0 state or 1 state. For example, if a bit of data is in a 0 state, the latch can represent the 0 state of the bit by placing the first SRAM FET mndt 155 in an ON state and the second SRAM FET mndc 160 in an OFF state. Conversely, if the bit of data is in a 1 state, the latch can represent the 1 state of the bit by placing the first SRAM FET mndt 155 in an OFF state and a second SRAM FET mndc 160 in an ON state.

The volatile portion 102 further includes first and second pull-up transistors mpdt 145 and mpdc 150 to aid the first and second SRAM FETs 155, 160 in latching a bit of data from the nonvolatile portion 101 or from an exterior environment. The gate of the first pull-up p-channel transistor mpdt 145 is coupled to the gate of the first SRAM FET mndt 155. The gate of transistor mpdt 145 is also connected to the drain of second SRAM FET mndc 160 and the source of second pull-up transistor mpdc 150. The source of the p-channel transistor mpdt 145 is coupled to the drain of the first SRAM FET mndt 155, which is identified as dt node 175. Similarly, the gate of the second pull-up p-channel transistor mpdc 150 is coupled to the gate of the second SRAM FET mndc 160. The gate of second pull-up transistor mpdc 150 is also coupled to the drain of first SRAM FET mndt 155 and the source of first pull-up transistor mpdt 145. The source of the p-channel transistor mpdc 150 is coupled to the drain of the second SRAM FET mndc 160. There are a number of alternatives to the use of pull-up p-channel transistors. For example, depletion n-channel FETs or pull-up resistors can be utilized.

Also included in the volatile portion 102 are first and second transfer or pass FETs 165, 170 for transferring a bit of data between the latch formed by the first and second SRAM FETs 155, 160 and the exterior environment. The gate of each of the first and second transfer FETs 165, 170 is connected to a word line. The drains of the first and second transfer FETs 165, 170 are respectively connected to nodes dt 175 and dc 180. The sources of the first and second transfer FETs 165, 170 are respectively connected to bit lines 107, 106. The first and second transfer FETs 165, 170 function as switches that are placed in an ON state to transfer a bit of data between the latch and the bit lines 107, 106 and otherwise placed in an OFF state. The state of the first and second transfer FETs 165, 170 (ON or OFF) is controlled by a signal applied to the word line.

The nonvolatile portion 101 includes a first silicon oxide nitride oxide semiconductor (SONOS) FET 110 and a second SONOS FET 125 for respectively storing the state of the first SRAM FET 155 and the second SRAM FET 160 in the volatile portion 102. The state of the first and second SRAM FETs 155, 160 is stored in the first and second SONOS FETs 110, 125 by forcing, in a store operation, the threshold voltages for turning ON the first and second SONOS FETs 110, 125 to reflect the states of the first and second SRAM FETs 155, 160. For example, if the first SRAM FET 155 is in an OFF state and the second SRAM FET 160 is in an ON state, the store operation would reflect this state of the first and second SRAM FETs 155, 160 by forcing the threshold voltage for turning ON the first SONOS FET 110 to be less than the threshold voltage for turning ON the second SONOS FET 125. This forcing is accomplished by appropriately cycling a VSE signal applied to the gates of SONOS FETs 110, 125. It should be appreciated that the SONOS FETs 110, 125 can be replaced with other types of nonvolatile storage elements, such as silicon nitride oxide semiconductor (SNOS) transistors, floating gate transistors, ferroelectric transistors, and capacitors to name a few.

The nonvolatile portion 101 further includes a first store FET 115 and a second store FET 130 that operate as switches during store and recall operations to appropriately configure the nonvolatile portion 101 for the transfer of a bit of data between the volatile portion 102 and the nonvolatile portion 101. More specifically, the first and second store FETs 115, 130 function to connect the nonvolatile portion 101 to the volatile portion 102 during store and recall operations and to otherwise disconnect the nonvolatile portion 101 from the volatile portion 102. The state of the first and second store FETs 115, 130 is controlled by a $V_{STR}$ signal that is applied to the gates of the FETs. More specifically, if the $V_{STR}$ signal is LOW, the first and second store FETs 115, 130 are turned OFF to disconnect the nonvolatile portion 101 from the volatile portion 102. Conversely, if the $V_{STR}$ signal is HIGH, the first and second store FETs 115, 130 are turned ON to connect the nonvolatile portion 101 to the volatile portion 102. Typically, a LOW signal is approximately 0V and a HIGH signal is approximately 3.3V.

The nonvolatile portion 101 further includes a first recall FET 105 and a second recall FET 120 that also function as switches to place the nonvolatile portion 101 in the appropriate configuration for transferring a bit of data between the volatile portion 102 and the nonvolatile portion 101 during store and recall operations. More specifically, the first and second recall FETs 105, 120 function to connect the nonvolatile portion 101 to $V_{CCT}$ during a recall operation and to disconnect the nonvolatile portion 101 from the $V_{CCT}$ during a store operation and otherwise. The state of the first and second recall FETs 105, 120 is controlled by a $V_{RCL}$ signal that is applied to the gates of the FETs. More specifically, if the $V_{RCL}$ signal is LOW, the first and second recall FETs 105, 120 are turned OFF to disconnect the nonvolatile portion 101 from $V_{CCT}$. Conversely, if the $V_{RCL}$ signal is HIGH, the first and second recall FETs 105, 120 are turned ON to connect the nonvolatile portion 101 to $V_{CCT}$. In a preferred embodiment of the present invention, the control signals on the $V_{RCL}$, $V_{SE}$, $V_{STR}$ and word lines WL are provided by a device control unit (illustrated in FIG. 2).

Figure 2:
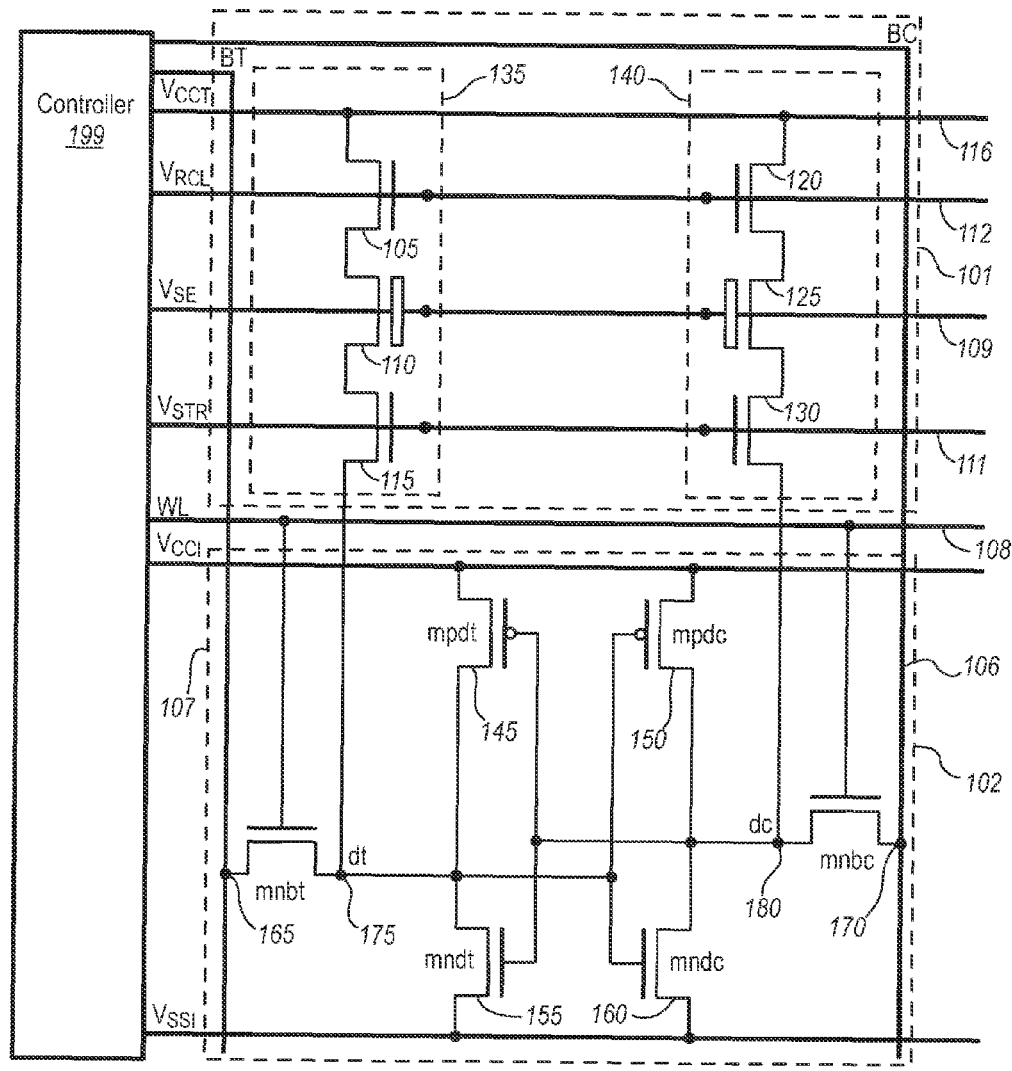
FIG. 2 is a schematic diagram illustrating an nvSRAM memory cell of FIG. 1 with an attached controller.

As illustrated in FIG. 2, a controller 199 is included in the nvSRAM device 100 for (1) providing signals to SRAM cell 102 to transfer a bit of data between the SRAM cell 102 and the exterior environment; (2) providing signals to the SRAM cell 102 and the non-volatile portion 101 to copy a bit of data from the SRAM cell 102 into the non-volatile portion 101, i.e., cause a store operation to be performed; and (3) providing signals to the SRAM cell 102 and the non-volatile portion 101 to copy a bit of data from the non-volatile portion 101 to the SRAM cell 102, i.e., cause a recall operation to be performed. The controller 199 performs the noted operations based upon signals received from a device, typically a microprocessor, that is located exterior to the nvSRAM device 100. For example, if a microprocessor required the bit of data stored in the SRAM 102, it would issue a command to the controller 199. In response, the controller 199 would provide the signals to the SRAM cell 102 to cause the bit of data in the SRAM cell 102 to be transferred to the exterior environment. The microprocessor can also request a store or recall operation with respect to one or the other of the non-volatile memory cells in the non-volatile portion 101.

The controller also performs certain operations without direction from a microprocessor. For instance, the controller 199 is capable of independently sensing when power is initially being applied to the device 100 and, in response, causing a recall operation (power-up recall operation) to be performed with respect to one of the non-volatile memory cells in the non-volatile portion 101. Conversely, the controller 199 is capable of sensing when power is being removed from the device 100 and, in response, causing a store operation (power-down store operation) to be performed with respect to one of the non-volatile memory cells in the non-volatile portion 101. The non-volatile memory cell in the non-volatile portion 101 to which the bit of data in the SRAM cell 102 is transferred in the case of a power-down and the non-volatile memory cell in the non-volatile portion 101 from which a bit of data is recalled in the event of a power-up is established in the nvSRAM 100 during manufacture. Alternatively, the nvSRAM 100 is designed to permit the user to configure or define which non-volatile memory cell is to be used in power-down store operations and which non-volatile memory cell is to be used in power-up recall operations. This configurability can be achieved via a command that is issued to the nvSRAM 100 or any of the other ways known in the art.

It should be appreciated that other nonvolatile configurations are possible to achieve the functions of the nonvolatile portion 101 of the cell 100 and the invention is in no way limited to the particular configuration illustrated in FIG. 1. The particular configuration utilized in any application will depend upon both technological and performance criteria.

During normal SRAM cell operation, node $V_{STR}$ is held low which disconnects the nonvolatile section 101 of the nvSRAM cell from the volatile section 102. In other words, there is typically no communication between volatile section 102 and nonvolatile section 101 of the memory cell 100. The volatile section 102 of memory cell 100 is accessed in the following manner. The word line, WL 108, is raised to approximately 1.8V to turn on the pass transistor gates 115, 130 and the data is read or written differentially through the bit lines, BT 107 and BC 106. The transfer of data from the volatile section 102 to the non-volatile section 101, i.e. a STORE operation, takes place in two steps, during which the word line, WL 108, is OFF or at 0V (i.e., ground).

During the first step, the erase portion of the STORE cycle, nonvolatile control lines $V_{STR}$ 111 and $V_{RCL}$ 112 remain low or OFF, which is typically 1.8V. Then, nonvolatile transistor gate of SONOS transistors 110, 125 is pumped down to a negative supervoltage through node $V_{SE}$ 109 sufficient to positively charge the nitride dielectric through direct tunneling across the ultrathin tunnel oxide. In a typical arrangement, the negative supervoltage is approximately −10V. Node $V_{SE}$ 109 is held at the negative supervoltage long enough to convert all the threshold voltages, $V_T$, of all the nitride transistors in the array to equal depletion values. The erase portion of the STORE cycle is completed by discharging $V_{SE}$ back to ground.

For the second step, the program portion, assume for illustrative purposes that the last SRAM cycle left a HIGH data state on the data true node, dt 175, and a LOW on the data compliment node, dc 180 of the volatile section 102. Node $V_{STR}$ 111 is brought HIGH to approximately 3.3V and $V_{SE}$ 109 is pumped to a positive supervoltage. In a typical arrangement, the positive supervoltage applied to $V_{SE}$ 109 is approximately +10V. The transistor 130 gated by $V_{STR}$ 111 on the right side of the memory cell 100 is on, since its gate is HIGH and source is LOW, so the node defined by SONOS transistor 125 is held low. The entire supervoltage drops across the nitride dielectric, causing the dielectric to become negatively charged through direct tunneling of electrons from the channel into the nitride. The $V_T$ of nonvolatile transistor 125 therefore changes from depletion to enhancement. Therefore, the SONOS transistor 125 is referred to as the program cell or the programmed transistor since the $V_T$ of SONOS transistor 125 is at the programmed threshold $V_{Tp}$.

On the left side of the memory cell 100, the pass transistor 115 gated by $V_{STR}$ 111 is off since both source and gate are at the same high voltage. The transistor is cut-off, the node defined by SONOS transistor 110 is isolated and the channel of the nonvolatile transistor couples up with the rising $V_{SE}$ voltage 111. There is thus essentially no voltage across the nitride dielectric, no tunneling takes place and the $V_T$ of SONOS transistor 115 remains unchanged. This side of the cell has been program inhibited. A differential threshold voltage that reflects the existing volatile section 102 data is now established in the cell 100. Therefore, the SONOS transistor 110 is referred to as the erase cell or the erase transistor since the $V_T$ of SONOS transistor 110 remains at the erased threshold $V_{Te}$.

The RECALL cycle begins by clearing the existing SRAM data, first by discharging the bit lines, BT 107 and BC 106, and then by turning on the word line, WL 108. The word line 108 is then returned to ground. Both nodes $V_{STR}$ and $V_{RCL}$ are turned on, providing a charging path to the internal nodes of the volatile section 102 through the nonvolatile section 101 to the power supply 116. With nonvolatile gate, $V_{SE}$, held at ground and then assuming the preceding threshold voltages, the nonvolatile transistor 110 will conduct current while the transistor 125 will not. Node dt 175 charges up high, while node dc 180 remains low, thereby reestablishing the data corresponding to the last STORE cycle as explained above. The RECALL operation is completed by returning all control lines to their default states.

Figure 3:
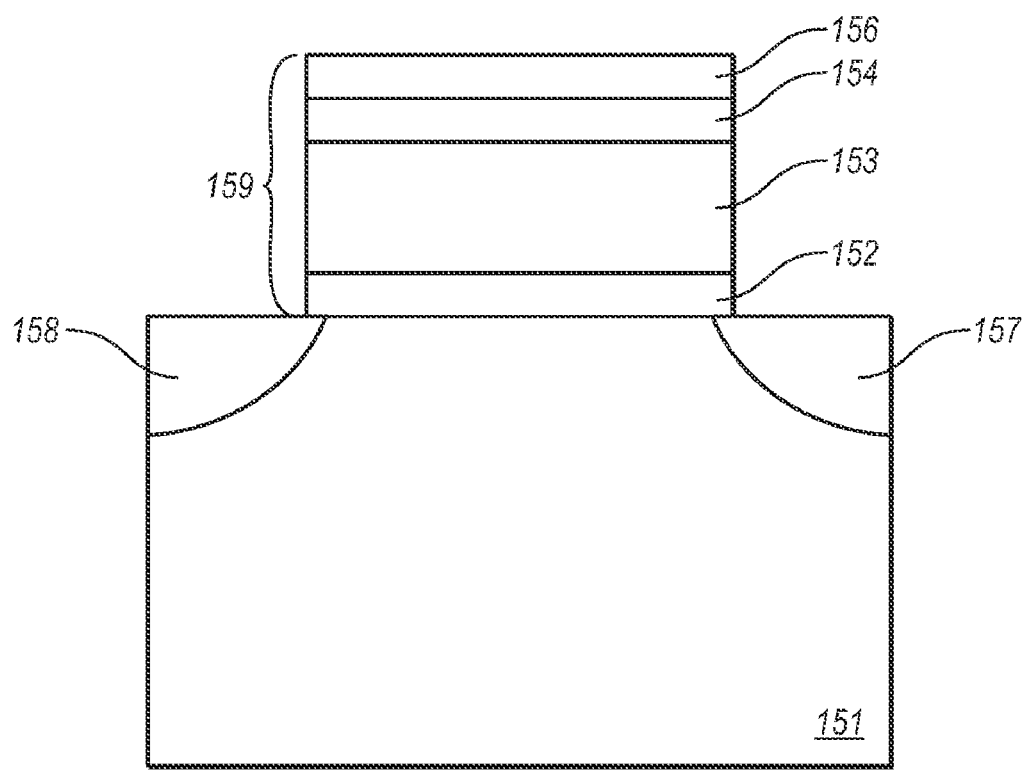
FIG. 3 is a silicon layer view of a SONOS transistor.

Embodiments of the present invention may be used with a memory cell structure of FIG. 3, which includes a transistor in an integrated circuit substrate 151, such as a silicon semiconductor substrate. The transistor includes a gate 159 having a charge trapping region 153 therein. More specifically, the transistor can comprise spaced apart source and drain regions 157 and 158, respectively, in the integrated circuit substrate 151 and the gate 159 on the integrated circuit substrate. The gate 159 comprises a tunnel insulating layer 152 on the substrate 151, the charge trapping region 153 on the tunnel insulating layer 152, a blocking insulating layer 154 on the charge trapping region 153, and a gate electrode 156 on the blocking insulating layer 154.

In the illustrated embodiment, the tunnel insulating layer 152 comprises oxide, the blocking insulating layer 154 comprises oxide, which may be the same as or different from the tunnel insulating layer, and the gate electrode 156 comprises conductive material. The charge trapping region 153 comprises a nitride. The blocking insulating layer 154 cuts off charges flowing into the charge trapping region 153 from the gate electrode 156 when operational voltages are applied to the gate electrode 156.

Referring again to FIG. 3, in order to program a memory cell according to some embodiments of the present invention, a voltage of 0V may be applied to the substrate 151, and a program voltage higher than 0V may be applied to the gate electrode 156. As a result, electrons in the channel tunnel through the tunnel insulating layer 152 to migrate to deep level traps in the charge trapping region 153. It will be understood that the program threshold voltage ($V_{Tp}$) is defined when charge is stored in the charge trapping region.

In an erasing operation, an erase voltage, which may be of uniform or non-uniform level, is applied to the gate 156 for a time interval that is sufficient to lower the threshold voltage of the transistor from the program threshold voltage $V_{Tp}$ to an erase threshold voltage ($V_{Te}$) that is lower than the program threshold voltage $V_{Tp}$. In the erase operation, at least some of the electrons in the charge trapping region 153 tunnel through the tunnel insulating layer 152 into the substrate 151 into a channel in the substrate 151 that is formed beneath the gate 159. Thus, the erase threshold voltage is defined when an erase voltage is applied to the gate 159 that is sufficient to discharge at least some of the charge that is stored in the charge trapping region 153.

Figure 4:
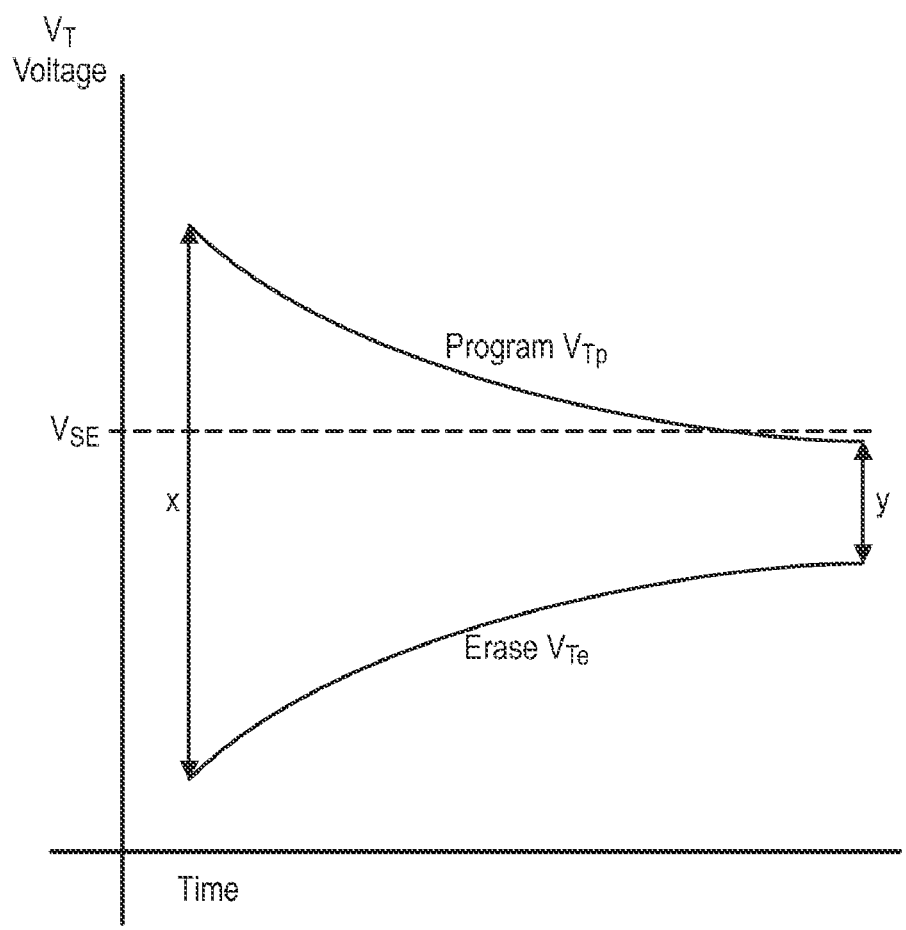
FIG. 4 illustrates a graph of the threshold voltage ($V_T$) for a SONOS transistor illustrated in FIG. 2, and its degradation over time.

FIG. 4 illustrates a graph of the threshold voltage ($V_T$) for a SONOS transistor illustrated in FIG. 2, and its degradation over time. The top curve represents the program threshold voltage $V_{Tp}$ and the bottom curve represents the erase program voltage $V_{Te}$. As illustrated, early on in the life of the SONOS transistor, the $V_T$ window is defined as the difference between $V_{Tp}$ and $V_{Te}$, represented by the difference "x" in FIG. 4. As time progresses, both the threshold voltages for programming and erasing, $V_{Tp}$ and $V_{Te}$ degrade and the $V_T$ window also decreases, as represented by the difference "y" in FIG. 4.

For a RECALL operation as explained above, $V_{SE}$ is chosen to have a value within the $V_T$ window. As shown in FIG. 2A, if the value of $V_{SE}$ is selected when the window is "x," as degradation in the threshold voltages occurs and the window shrinks to "y," $V_{SE}$ is no longer within the $V_T$ window and the RECALL function fails. Therefore, having a $V_{SE}$ that fails to adapt to the change in the $V_T$ window is undesirable. Other things may cause a shift in the $V_T$ window such as process corners and data dependencies to name a few.

Figure 5:
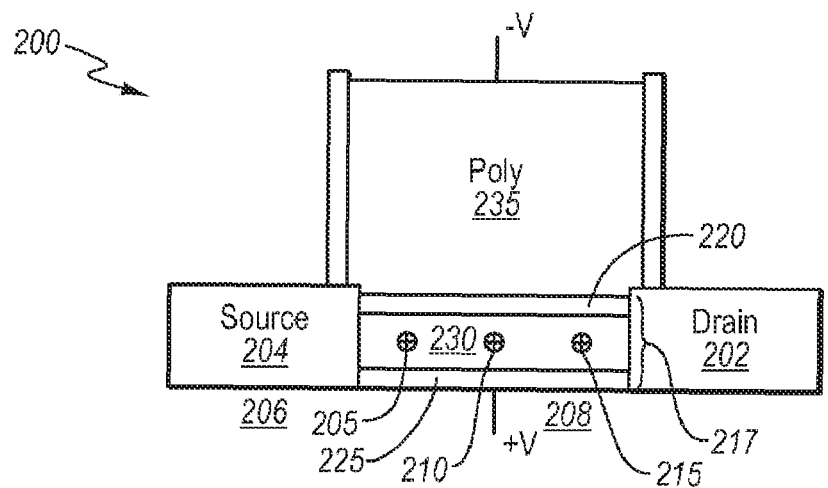
FIG. 5 illustrates an under-erase condition for a SONOS transistor.

As illustrated in FIG. 5, the memory cell structure of the non-volatile cells in a typical nvSRAM embodiment have a conventional non-volatile SONOS memory cell 200 comprising a p-type semiconductor substrate 206 with an n-type source 204 and drain 202 formed therein. In the illustrated embodiment, a body 208 is formed between the source 204 and the drain 202. An oxide-nitride-oxide (ONO) dielectric stack 217 is formed above the body 208. A polysilicon gate electrode 235 is formed over the ONO stack 217. The ONO stack 217 includes a first or bottom oxide layer, typically referred to as a tunnel oxide 225, a silicon nitride charge storing layer 230 and a top silicon dioxide layer 220.

Charge is transferred to the silicon nitride charge-storing layer 230 by application of a high voltage to the polysilicon gate electrode 235 via Fowler-Nordheim tunneling and direct tunneling. A negative voltage transfers holes 205, 210, 215 to the nitride layer 230 producing an erased condition, while a positive voltage transfers electrons to the nitride layer 230 producing a programmed condition. In this way a bi-stable cell can be created whereby the erased cell is a depletion mode device and the programmed cell is an enhancement device. The state of the cell can be sensed when a voltage that is between the programmed and erased voltage threshold of the cell is applied to the gate, and a voltage is applied to the drain of the device. In this condition, the cell will conduct current when the cell is erased but not when programmed. The voltage applied to the polysilicon electrode 235 while programming is called the program voltage, while the voltage applied during erase is the erase voltage.

FIG. 5 additionally illustrates a typical under-erase condition. In an under-erase condition, too few holes 205, 210, 215 are injected into the nitride layer 230 to sufficiently lower the transistor $V_T$. The operation of SONOS transistor 200, therefore, is seriously impaired. In an under-erase condition the erase transistor $V_T$ is not a depletion device with respect to the recall voltage $V_r$ on the gate of the erase transistor during recall; in effect it is in an "off" state instead of the required "on" state. In this case the recall will fail. Since erase processes are slower at low temperatures, this is a concern for low temperature stores operations. The erase $V_T$ needs to be sufficiently low to ensure that low temperature stores will be successful.

One embodiment of the invention includes circuitry capable of adjusting the erase voltage as well as the erase time of the NV cells by commands issued by automatic test equipment, and storing the optimum erase voltage setting and erase time setting in each device in non-volatile memory storage locations. Similar circuitry for setting program voltage and program time are also included in the illustrated embodiment.

Figure 6:
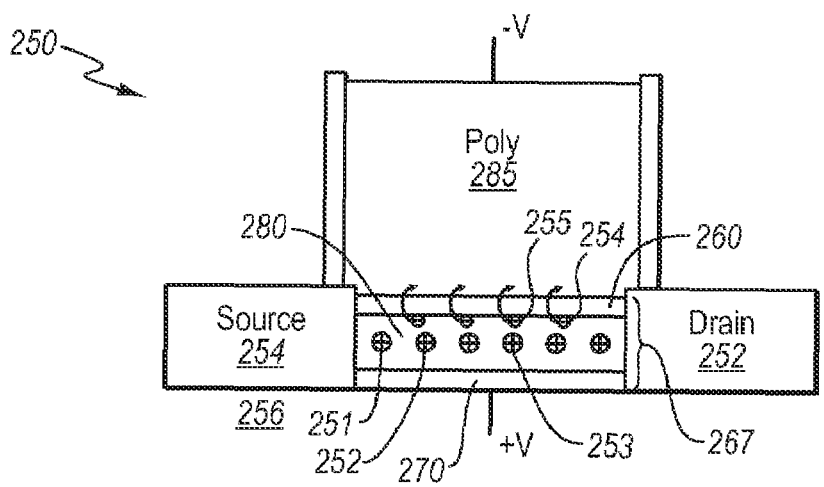
FIG. 6 illustrates an over-erase condition for a SONOS transistor.

Another aspect of the method pertains to the method of prevent erase over-saturation to an erased non-volatile cell. As illustrated in FIG. 6, erase over-saturation is a well-known phenomenon whereby a SONOS cell 250 is erased by a negative over-voltage on its polysilicon electrode 285 such that high-energy electrons 254, 255 are accelerated across the top oxide layer 260, thereby causing damage to the top oxide as well as the interface states at the Silicon-tunnel oxide interface. Repeated over-erases cause the erased threshold voltage ($V_{te}$) to increase, finally leading to non-volatile cell failure as $V_{te}$ increases to the point where it approaches and then surpasses the gate read voltage ($V_r$) and the difference between and programmed and erased cell cannot be distinguished, thus leading to RECALL failure. The number of over-erases also limits the number of endurance cycles possible for the non-volatile cells.

Figure 7:
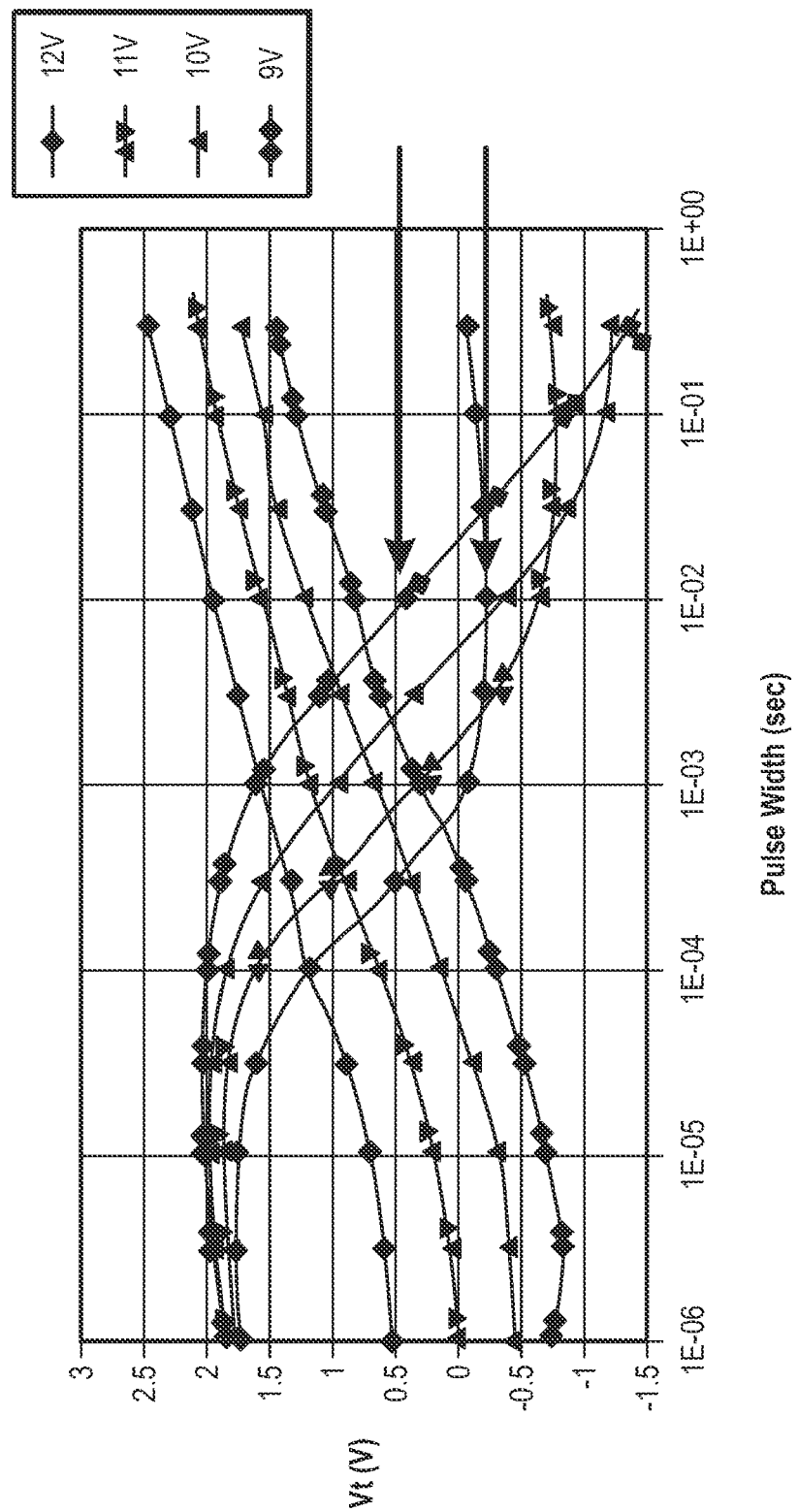
FIG. 7 illustrates an over-erase and under-erase condition graphically.

FIG. 7 graphically illustrates both an over-erase and under-erase condition for varying levels of $V_{SE}$, specifically, from a value of −9V to −12V. The four erase curves show the various times the SONOS transistors in the tri-gate structure saturate, if at all, for the various erase voltages, −12V, −11V, −10V and −9V respectively. For example, for a voltage of −12V, the erase curve saturates at approximately 1 ms and the corresponding $V_T$ is −0.2V. This value of $V_T$ for a −12V erase voltage represents an over saturated condition. At a voltage of −9V, the erase curve does not saturate and the corresponding $V_T$ is approximately 0.5V. This value of $V_T$ for a −9V erase voltage represents an under saturated condition. In accordance with the erase curves of FIG. 7, the given erase voltages of −10V and −1V saturate at 100 ms and 10 ms respectively, and correspond to a $V_T$ of approximately −0.8 and −1.2 respectively.

Figure 8:
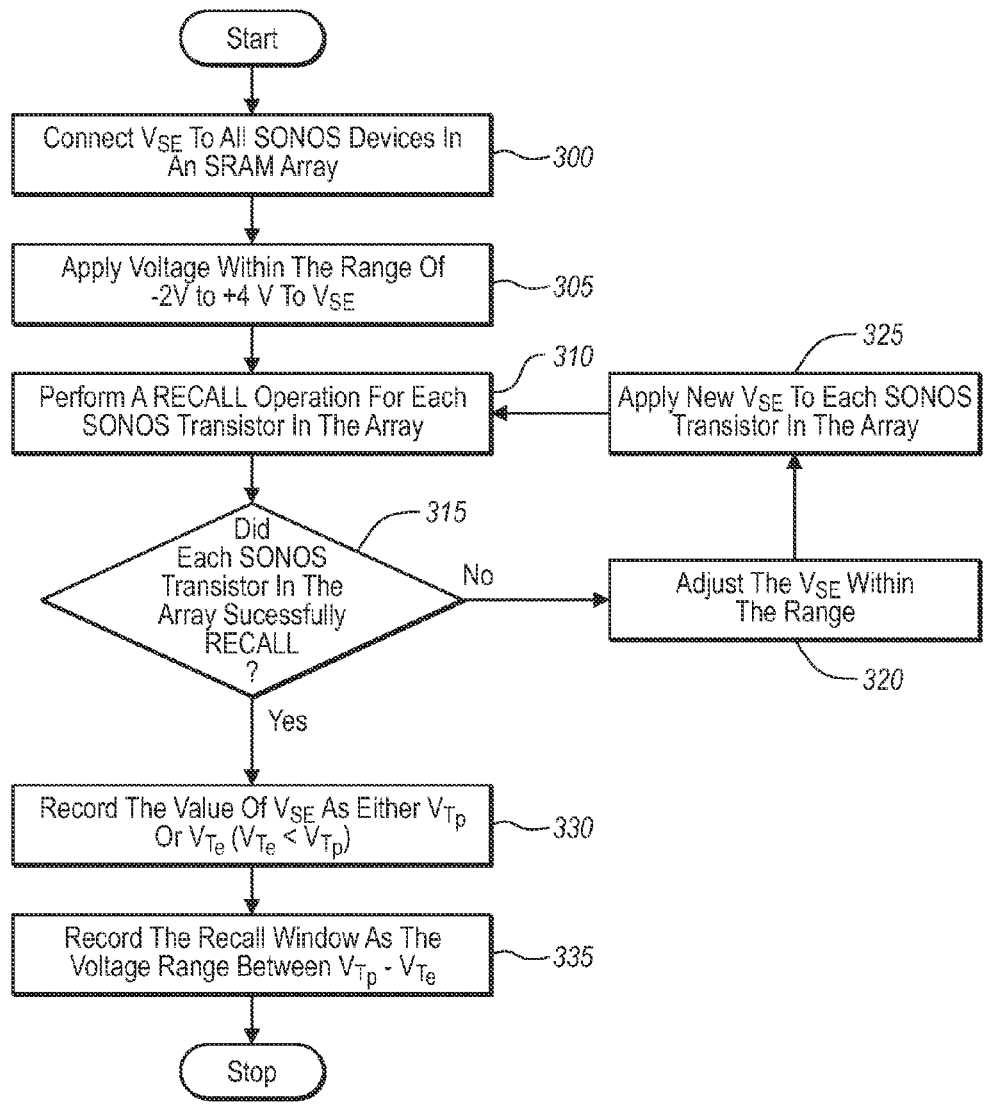
FIGS. 8-10 illustrate the method of margin mode testing.
Figure 9:
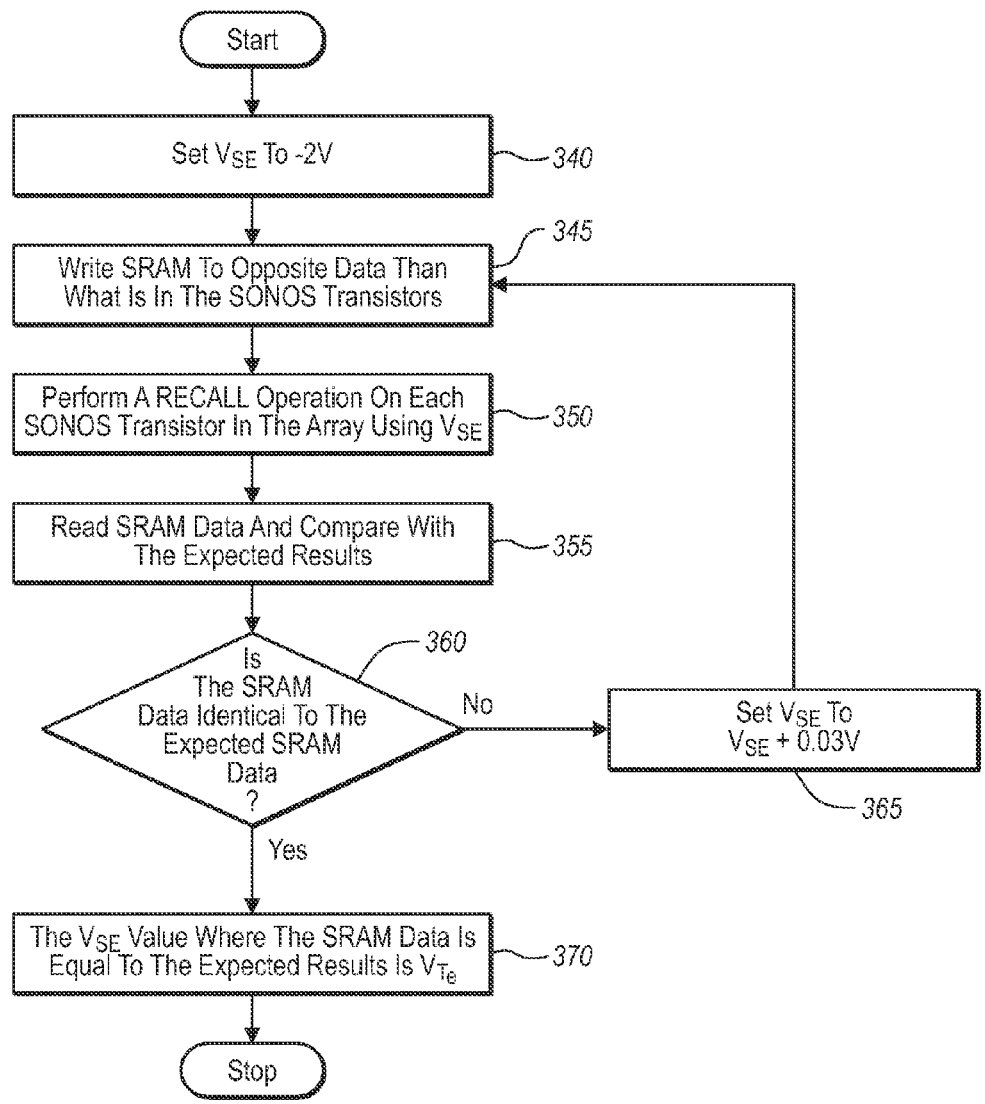
Figure 10:
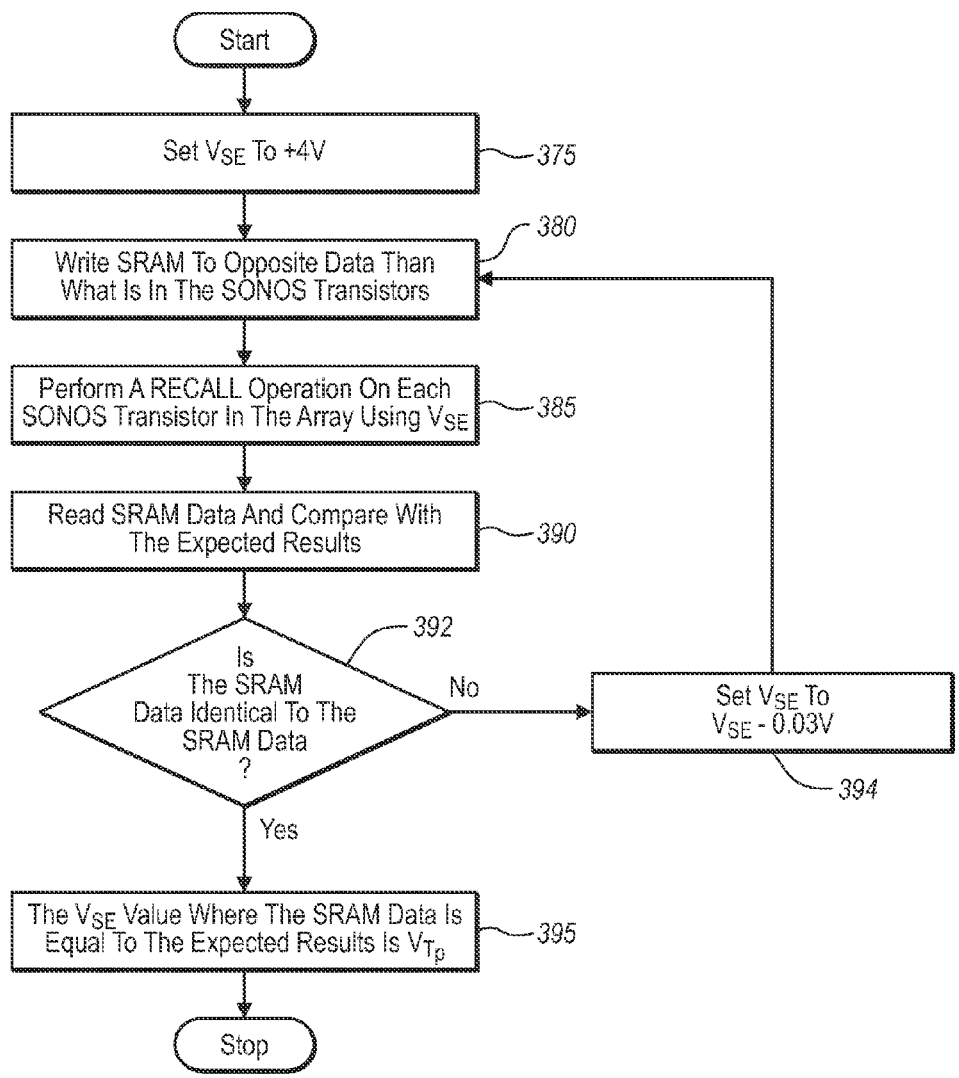

FIGS. 8-10 illustrate, in a flow chart, an existing method for measuring the $V_{Te}$ and $V_{Tp}$ by margin mode testing. A margin mode test is specific to the SONOS transistors in, for example, a 1 Mb array device, but should have applications to all devices including for example, a 4 Mb array device as well. The object of margin mode is to measure the $V_T$'s of erase and programmed transistors on a device. These $V_T$'s will vary depending on process, temperature, erase and program voltages, erase and program times, and history of the device.

In accordance with FIG. 8, the term $V_{SE}$ is used to mean the gate voltage on the SONOS devices during a recall. During a recall in step 300, $V_{SE}$ is connected to all SONOS devices in an nvSRAM array at the same time since all cells are recalled at the same time. During margin mode testing in step 305, many recalls are performed as $V_{SE}$ is varied over a practical range of −2V to +4V. In step 310, a RECALL operation as described above is then performed on each SONOS transistor in the array. Each RECALL operation produces either a pass or a fail condition in the entire SRAM array, some cells will fail at a given $V_{SE}$ voltage and some cells will pass. In step 315, if the $V_{SE}$ does not produce a successful RECALL operation in each SONOS transistor in an array, the $V_{SE}$ is adjusted to a new voltage within the array in step 320 and the new $V_{SE}$ is applied to the SONOS transistors in step 325.

Certain extreme settings of $V_{SE}$ during a recall will always produce failing cells, such as −2V or +4V. However, even at these extreme cases, a few cells may pass—i.e., latch their associated SRAM cell with the expected data. As $V_{SE}$ approaches the pass region, more and more bits will pass until no failures occur during a recall. In step 330, the point that each SONOS transistor in the array performs a successful RECALL operation is the value of either $V_{Te}$ (erase $V_T$) or $V_{Tp}$ (program $V_T$) with $V_{Te} < V_{Tp}$. As stated previously, in step 335, the voltage range between $V_{Tp} - V_{Te}$ is called the recall window and is a measure of the data retention capability of the device.

FIG. 9 illustrates the steps of the margin mode testing designed to determine the erase voltage threshold $V_{Te}$ of the SONOS transistors in the array. In step 340, $V_{SE}$ is set to −2V. The SRAM portion of the nvSRAM is written to the opposite data in step 345 then what is in the SONOS transistors. A RECALL operation is then performed on each SONOS transistor in the array in step 350 using the appropriate value of $V_{SE}$. In step 355, the SRAM data is read and compared with the expected results. If the read SRAM data is not identical to the expected SRAM data in step 360, the $V_{SE}$ value is increased by 0.03V and the steps 345, 350, 355 and 360 are repeated. Once the read SRAM data is identical to the expected SRAM data, the value of $V_{SE}$ is recorded as $V_{Te}$ in step 370.

FIG. 10 illustrates the steps of the margin mode testing designed to determine the program voltage threshold $V_{Tp}$ of the SONOS transistors in the array. In step 375, $V_{SE}$ is set to +4V. The SRAM portion of the nvSRAM is written to the opposite data, in step 380, then what is in the SONOS transistors. A RECALL operation is then performed on each SONOS transistor in the array in step 385 using the appropriate value of $V_{SE}$. In step 390, the SRAM data is read and compared with the expected results. If the read SRAM data is not identical to the expected SRAM data in step 392, the $V_{SE}$ value is decreased by 0.03V and the steps 380, 385, 390 and 392 are repeated. Once the read SRAM data is identical to the expected SRAM data in step 395, the value of $V_{SE}$ is recorded as $V_{Tp}$.

In accordance with the current invention, one method for preventing over-saturation is achieved by measuring the cell $V_{te}$ by margin mode, for example, when a single erase is performed on a non-volatile cell. The margin mode result of a single erase is compared to the cell $V_{te}$ when a number of erases are performed in succession to generate a saturated erase condition $V_{teSat}$. The number of consecutive erases performed can be between at least 2 and 100, and is preferably set to 2 consecutive erases. The difference between the cell $V_{te}$ and $V_{teSat}$ is calculated and the erase voltage is either decreased in magnitude or increased in magnitude to either decrease or increase the non-volatile cell erase saturation. The process is repeated until the $V_{te} - V_{teSat}$ falls within a specified range to ensure the proper degree of erase saturation. The $V_{te} - V_{teSat}$ condition that meets the specified endurance and data retention limits of the product can be determined by characterization of the product with respect to $V_{te} - V_{teSat}$.

Another aspect of the method includes a method for programming non-volatile cells such that data retention specifications are achieved. During non-volatile cell programming, a high positive voltage is applied to the polysilicon electrode 330 of non-volatile SONOS cell 301 prompting Fowler-Nordheim and direct tunneling of electrons from the silicon substrate 300 to the silicon nitride charge storage layer 320. Sufficient charge must be transferred so that the program voltage threshold $V_{tp}$ remains above $V_r$ throughout the device's expected data retention lifetime, taking into account electron decay rates at the device's use condition.

If electron decay rates are known, then the formula:

$$Vtp_{min} = DR \times T_L + V_r$$

where $Vtp_{min}$=Minimum Vtp
DR=Electron decay rate
$T_L$=Device lifetime in log 10 (sec)
$V_r$=read voltage of NV cell is applied to determine $Vtp_{min}$. The method for ensuring data retention then utilizes a programming cycle of a non-volatile cell followed by a measurement of the programmed cell Vtp, for example by a margin mode circuit. If Vtp<$Vtp_{min}$ then the programming voltage is increased, or programming time is increased and the process is repeated until Vtp>Vtp$_{min}$.

The electron decay rate (DR) may be calculated from margin mode testing results at various temperatures. In one example, margin mode measurements are taken at the initial write and all subsequent read points for both V$_{Te}$ and V$_{Tp}$ corresponding to the 0th failing bit and the 8000th failing bit, respectively. The margin mode data is combined with margin mode data taken at elevated temperatures on the same wafers. Decay rates are calculated and models fit to the decay rates to develop an acceleration factor from high temperature to low temperature. It is found that the decay rate as a function of temperature may be calculated from the following:

$$DR = -0.0973 - 0.000506 * \text{temperature (in } ^\circ \text{C.)}$$

This equation is typical for a 25 μm SONOS technology. One skilled in the art will understand that this formula is empirically derived formula specific to a particular process and that any formula that calculates the decay rate may be used without departing from the intended scope and spirit of the present invention.

Figure 11:
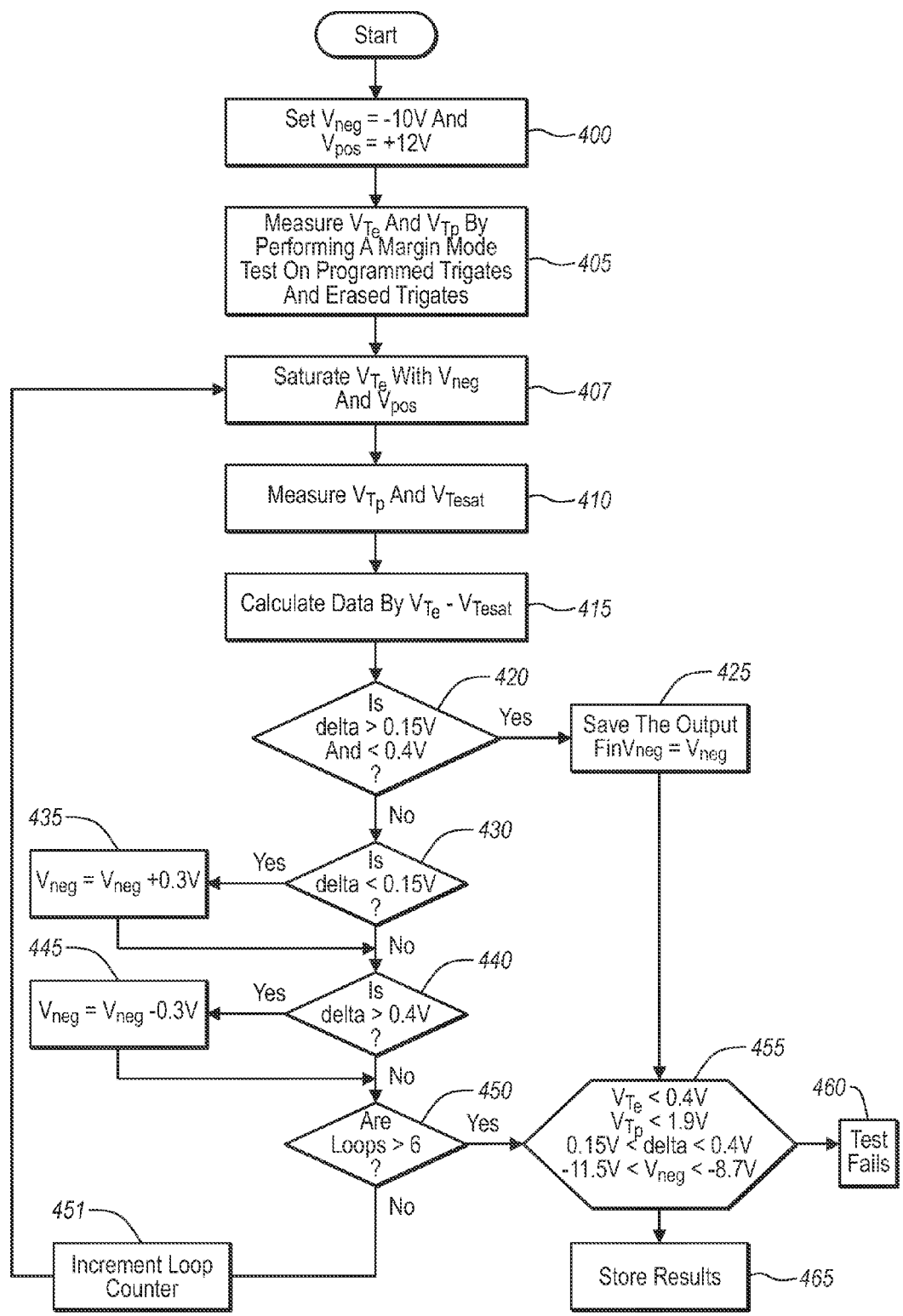
FIG. 11 shows a flowchart for an exemplary embodiment of the method implemented in test code for 1 Mb and 256 Kb nvSRAM devices.

FIG. 11 illustrates a flow chart that steps through one embodiment of the method of the present invention. The steps of the method in FIG. 11 is best understood with reference to the previous description for margin mode testing illustrated and described with respect to FIGS. 8-10. It should be understood that the steps are illustrative for descriptive purposes only and should not be taken as limiting the invention in any way. V$_{neg}$ (the value of V$_{SE}$ for an erase operation) is set to −10V and V$_{pos}$ (the value of V$_{SE}$ for a program operation) is set to +12.5V in step 400. In step 400, the program V$_T$ and erase V$_T$ are measured by performing a margin mode test on the programmed trigates and erased trigates. V$_{Te}$ is saturated with the values of V$_{neg}$ and V$_{pos}$ in step 407. In step 410, the values of V$_{Tp}$ and V$_{Tesat}$ are measured. The value of delta is calculated in step 415 by computing the difference between V$_{Te}$ and V$_{Tesat}$. In step 420, delta is examined to determine if it is within the range of 0.15V and 0.4V—i.e., is delta greater than 0.15V and less than 0.4V. If the delta is within the range, in step 425 the FinV$_{neg}$ is set to the value of V$_{neg}$. If V$_{Te}$ is less than 0.4V and V$_{Tp}$ is greater than 1.9V, and delta is in a range of 0.15 and 0.4 and V$_{neg}$ is in a range of −11.5 and −8.7, the value of V$_{neg}$ is stored in memory for later retrieval and use, as shown in steps 455 and 465. If the conditions are not met, in step 460, the test fails.

If in step 420 it is determined that the delta is outside the range, in step 430 it is determined if the value of delta is less than 0.15. If delta is less than 0.15V, then V$_{neg}$ is increased by 0.3V in step 435. If the value of delta is greater than a value of 0.4V, then the value of V$_{neg}$ is decreased by −0.3V, as shown in step 445. It is then determined if the number of loops is greater than six, if not the value of V$_{neg}$ is used as described with respect to step 407.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for preventing oversaturation in a first and second tri-gate structure in a non-volatile SRAM cell, said non-volatile SRAM having a volatile portion and a non-volatile portion, each tri-gate structure in said non-volatile portion having a recall transistor, a store transistor and a SONOS transistor, said method comprising:
   a) measuring a threshold erase voltage for each SONOS transistor in said cell when applying an erase voltage said each SONOS transistor;
   b) generating a saturated erase condition voltage for each SONOS transistor in said cell by performing a plurality of erase procedures in succession;
   c) calculating a delta value for the difference between said threshold erase voltage and said saturated erase condition voltage;
   d) determining if said delta value is within a specified range;
   e) modifying said erase voltage if said delta value is outside said range and thereafter repeating said steps a) through d) of said method until said delta is within said specified range; and
   f) storing said erase voltage if said delta value is within said specified range.

2. The method of claim 1, wherein said step a) further comprises performing a margin mode test on said each SONOS transistor in said first and second tri-gate structure.

3. The method of claim 1, wherein said step e) further comprises increasing said erase voltage if said delta value is greater than an upper value of said range.

4. The method of claim 3, wherein said step e) further comprises decreasing said erase voltage if said delta value is less than a lower value of said range.

5. The method of claim 4, wherein said upper value of said range is 0.4V and said lower value of said range is 0.15V.

6. The method of claim 5, wherein said erase voltage is increased by 0.3V if said delta value is greater than 0.4V.

7. The method of claim 5, wherein said erase voltage is decreased by 0.3V if said delta value is less than 0.15V.

8. The method of claim 1, wherein said plurality of erase procedures is between 2 and 100.

9. The method of claim 8, wherein said plurality of erase procedures is 2.

10. A method for preventing oversaturation in a first and second tri-gate structure in a non-volatile SRAM cell, said non-volatile SRAM having a volatile portion and a non-volatile portion, each tri-gate structure in said non-volatile portion having a recall transistor, a store transistor and a SONOS transistor, said method comprising:
   a) selecting a beginning level of an erase voltage to erase said SONOS transistors in said trigate structure;
   b) applying said erase voltage to said SONOS transistors in said trigate structure a first time;
   c) measuring a threshold erase voltage for each SONOS transistor in said cell when applying an erase voltage said each SONOS transistor;
   d) applying said erase voltage to said SONOS transistors in said trigate structure a plurality of times after said first time;
   e) measuring a saturated erase condition voltage for each SONOS transistor in said trigate structure after a final time of said plurality of times;
   f) calculating a value of delta, said delta value being the difference between said threshold erase voltage and said saturated erase condition voltage;
   g) determining if said delta value is within a specified range;
   h) modifying said erase voltage if said delta value is outside said range and thereafter repeating said steps b) through g) of said method using said modified erase voltage in place of said erase voltage until said delta is within said specified range; and i) storing said erase voltage if said delta value is within said specified range.

11. The method of claim 10, wherein said specified range comprises an overerased voltage limit and an undererased voltage limit.

12. The method of claim 11, wherein said undererased voltage limit is 0.4V.

13. The method of claim 12, wherein said overerased voltage limit is 0.15V.

14. The method of claim 10, wherein said plurality of timed is five.

15. The method of claim 10, wherein said delta value is computed by subtracting said saturated erase condition voltage from said threshold erase voltage.

16. A method for modifying the programming voltage in a first and second tri-gate structure in a non-volatile SRAM cell, said non-volatile SRAM having a volatile portion and a non-volatile portion, each tri-gate structure in said non-volatile portion having a recall transistor, a store transistor and a SONOS transistor, said method comprising:

a) calculating a minimum programming threshold voltage for said non-volatile section of said non-volatile SRAM;

b) programming said first trigate structure in said non-volatile section;

c) measuring a threshold programming voltage for said SONOS transistor in said first trigate structure when applying said programming voltage to said SONOS transistor;

d) comparing said minimum threshold voltage with said threshold programming voltage;

e) increasing said programming voltage if said threshold voltage is less than said minimum threshold voltage and thereafter repeating steps b) through e) until said threshold voltage is greater than said minimum threshold voltage; and f) storing said programming voltage in memory if said threshold voltage is greater than said minimum threshold voltage.

17. The method of claim 16, wherein said minimum threshold voltage is determined from an electron decay rate, a device lifetime and a read voltage of said non-volatile section.

18. The method of claim 17, wherein said minimum threshold voltage is determined by multiplying together said electron decay rate, said device lifetime and said read voltage of said non-volatile section.

* * * * *